US010642733B1

(12) United States Patent
Hayut

(10) Patent No.: US 10,642,733 B1
(45) Date of Patent: May 5, 2020

(54) SYSTEM AND METHOD FOR MEMORY INTERFACE LOAD BALANCING

(71) Applicant: LIGHTBITS LABS LTD., Kfar Saba (IL)

(72) Inventor: Ofer Hayut, Rosh Pina (IL)

(73) Assignee: LIGHTBITS LABS LTD., Kfar Saba (IL)

( * ) Notice: Subject to any disclaimer, the term of this patent is extended or adjusted under 35 U.S.C. 154(b) by 0 days.

(21) Appl. No.: 16/033,314

(22) Filed: Jul. 12, 2018

(51) Int. Cl.
*G06F 12/06* (2006.01)
*G11C 5/04* (2006.01)
*G06F 12/02* (2006.01)

(52) U.S. Cl.
CPC ...... *G06F 12/0607* (2013.01); *G06F 12/0292* (2013.01); *G11C 5/04* (2013.01)

(58) Field of Classification Search
CPC .................................................. G06F 12/0607
See application file for complete search history.

(56) References Cited

U.S. PATENT DOCUMENTS

| | | | | |
|---|---|---|---|---|
| 6,381,668 B1* | 4/2002 | Lunteren | ............. | G06F 12/0607 711/157 |
| 6,453,380 B1* | 9/2002 | Van Lunteren | ..... | G06F 12/0607 711/157 |
| 2004/0139290 A1* | 7/2004 | Wolrich | ............... | G06F 12/0607 711/157 |
| 2010/0037024 A1* | 2/2010 | Brewer | ............... | G06F 12/0607 711/127 |
| 2011/0047346 A1* | 2/2011 | Cypher | ............... | G06F 12/0607 711/202 |
| 2015/0082002 A1* | 3/2015 | Parra | ........................ | G06F 13/16 711/216 |
| 2015/0089168 A1* | 3/2015 | Kalyanasundharam | ...................... | G06F 12/0607 711/157 |
| 2015/0095595 A1* | 4/2015 | Wang | ................... | G06F 12/0607 711/157 |
| 2015/0100746 A1* | 4/2015 | Rychlik | .............. | G06F 12/0607 711/157 |

* cited by examiner

*Primary Examiner* — Edward J Dudek, Jr.
(74) *Attorney, Agent, or Firm* — Pearl Cohen Zedek Latzer Baratz LLP

(57) ABSTRACT

A system and a method of balancing a load of access of at least one computing device to an arbitrary integer number of connected memory devices associated with a memory cluster address space, the method including: determining, by a controller, a number N corresponding to an arbitrary integer number of memory devices connected to a plurality of memory interfaces, wherein N is between 1 and the number of memory interfaces; receiving, by the controller, at least one data object, corresponding to an original processor address (OPA) from the at least one computing device; computing, by the controller, at least one interleaving function according to N; and mapping, by an interleaving circuit, the OPA to a memory cluster address (MCA), according to the at least one interleaving function, so that the data object is equally interleaved among the N connected devices.

19 Claims, 6 Drawing Sheets

SYSTEM AND METHOD FOR MEMORY INTERFACE LOAD BALANCING

FIELD OF THE INVENTION

The present invention relates generally to computer system memory architecture. More specifically, the present invention relates to memory interface load balancing.

BACKGROUND OF THE INVENTION

A memory interface, such as Dual Inline Memory Module (DIMM) interfaces, are designed to provide memory capacity for processing-modules and ensure optimal memory access throughput.

Multiple memory interfaces are commonly used to increase the processing-module memory bandwidth. However, when the processing-module does not access the entire memory space, it may not be able to fully exploit the multiplied memory bandwidth. In such cases, it is said that the memory bandwidth is suboptimal.

Commercially available solutions to this long-standing problem may include receiving an initial physical address (IPA) and applying an address interleaving algorithm on the received address to produce a mapped physical address (MPA). The address interleaving algorithm may be implemented by dedicated hardware circuitry, and the mapped physical address may include a memory interface index, and a memory interface offset. The memory interface index may refer to an index of a memory device, and the memory interface offset may refer to an address offset from the start address of that device.

Commercially available implementations of an address-interleaving algorithm may include calculation of division and/or modulo of at least a portion of the initial physical address. For example:
  (a) The memory index (e.g., an index or identification of a memory device) of the mapped physical address may be calculated as an integer modulo of the initial physical address when divided the number of memory interfaces (e.g., memory interface index=initial physical address % number of memory interfaces).
  (b) The memory offset (e.g., an address offset from the start address of the memory device) of the mapped physical address may be calculated as an integer division of the initial physical address when divided the number of memory interfaces (e.g., memory-interface-offset=initial physical address/number of memory interfaces)

The terms "rank" and "interleaving rank" are used herein to refer to the number of memory interfaces or memory devices accessible for a processing module upon which the address-interleaving algorithm is applied.

The commercially available implementation of an address-interleaving method described above exhibits several problems. For example, a series of memory access operations with a pattern of a fixed address interval (e.g., a serial access to consecutive data objects of identical size) may always map to the same memory-interface and may thus not properly exploit multiplied memory bandwidth. For example, if the difference in address value between two consecutive memory accesses is an integer product of the interleaving rank (e.g., the number of memory interfaces), then the memory interface index may remain the same between the two consecutive memory access operations.

In another example, when the interleaving rank is not a power of 2 (e.g., not 2, 4, 8, etc.), or not a constant number, the implementation of division and modulo calculation in hardware may be resource consuming and time-wise challenging. For example, an Application-Specific Integrated Circuit (ASIC) implementation may require additional clock cycles and/or elaborated setup and hold timing constraints to accommodate a generic division solution.

State of the art processors, such as Intel Xeon, support interleaving ranks which may be a power of 2 number or equal to 3 or a combination thereof, as explained herein, but do not provide real interleaving for every possible value of the interleaving rank.

A system and a method for providing real interleaving for every value of interleaving rank at run time, in a manner that is hardware and time-wise efficient, and resilient to the effect of fixed address intervals is, therefore, required.

SUMMARY OF THE INVENTION

Some embodiments of the present invention include a system and a method of balancing a load of access of at least one computing device to an arbitrary integer number of connected memory devices associated with a memory cluster address space.

Some embodiments of the method may include:
  determining, by a controller, a number (N) corresponding to an arbitrary integer number of memory devices connected to a plurality of memory interfaces, wherein N may be between 1 and the number of memory interfaces;
  receiving, by the controller, at least one data object, corresponding to an original processor address (OPA) from the at least one computing device;
  computing, by the controller, at least one interleaving function according to N; and
  mapping, by an interleaving circuit, the OPA to a memory cluster address (MCA), according to the at least one interleaving function, so that the data object may be equally interleaved among the N connected devices.

According to some embodiments, mapping of the OPA of the at least one data object to an MCA may include:
  splitting the OPA to at least one of: a first section, that may include the most significant bits (MSBs) of the OPA, a second section that may include intermediate significant bits (ISBs), and a third section, that may include the least significant bits (LSBs) of the OPA;
  applying one or more interleaving functions to at least one of the first section, second section and third section; and
  concatenating the results of the one or more applied interleaving functions, to produce the MCA address.

According to some embodiments, computing a first interleaving function may include concatenating the bits of the first section and the third section and dividing the concatenation value by N. The division of the concatenation by N may further include:
  loading a list of indexed, integer quotient values according to N, to a first lookup table (LUT);
  introducing the concatenation value to the first LUT as an index; and
  receiving a quotient value from the first LUT, that may be the result of an integer division of the concatenation value by N.

According to some embodiments, computing a second interleaving function may include computing an integer modulo value, that may be the remainder of the division of the concatenation value by N.

For example, computing a second interleaving function may include:

loading a list of indexed, integer modulo values according to N to a second LUT;

introducing the concatenation value to the second LUT as an index; and receiving a first integer modulo value from the second LUT, that may be the remainder of the division of the concatenation value by N.

According to some embodiments, computing a third interleaving function may include:

applying a hash function on the second section of the OPA;

adding the result of the hash function to the first integer modulo value;

computing a second integer modulo value, that may be the remainder of the division of the addition value by N.

In some embodiments, computing of a second integer modulo value may include introducing the result of the addition to the second LUT as an index and receiving the second integer modulo value from the second LUT.

In some embodiments, concatenating the results of the one or more applied interleaving functions, may include concatenating the second modulo value, the second section and the quotient value to produce an MCA address.

In some embodiments, the OPA may be split to at least one of: a first section, which may include the MSBs of the OPA, a second section which may include intermediate-high significant bits (IHSBs), a third section which may include intermediate-low significant bits (ILSBs) and a fourth section which may include the LSBs of the OPA. Concatenation of the results of the one or more applied interleaving functions, may include concatenating the second modulo value, the second section, the quotient value and the fourth section, to produce an MCA address.

The hash function may be one of a Cyclic Redundancy Check (CRC) function and/or a checksum function, and a seed of the CRC function may be selected according to N.

Some embodiments of the present invention may include a system for balancing a load of access of at least one computing device to an arbitrary integer number of connected memory devices associated with a memory cluster address space. Some embodiments of the system may include: a controller; an interleaving circuit associated with the controller; and a plurality of memory interfaces.

In some embodiments, the controller may be configured to: determine a number (N) corresponding to an arbitrary integer number of memory devices connected to a plurality of memory interfaces. The number N may be between 1 and the number of memory interfaces.

The controller may be configured to receive at least one data object, corresponding to an original processor address (OPA) from the at least one computing device and compute at least one interleaving function according to N.

The interleaving circuit may be configured to map the OPA to a memory cluster address (MCA), according to the at least one interleaving function, so that the data object may be equally interleaved among the N connected devices.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
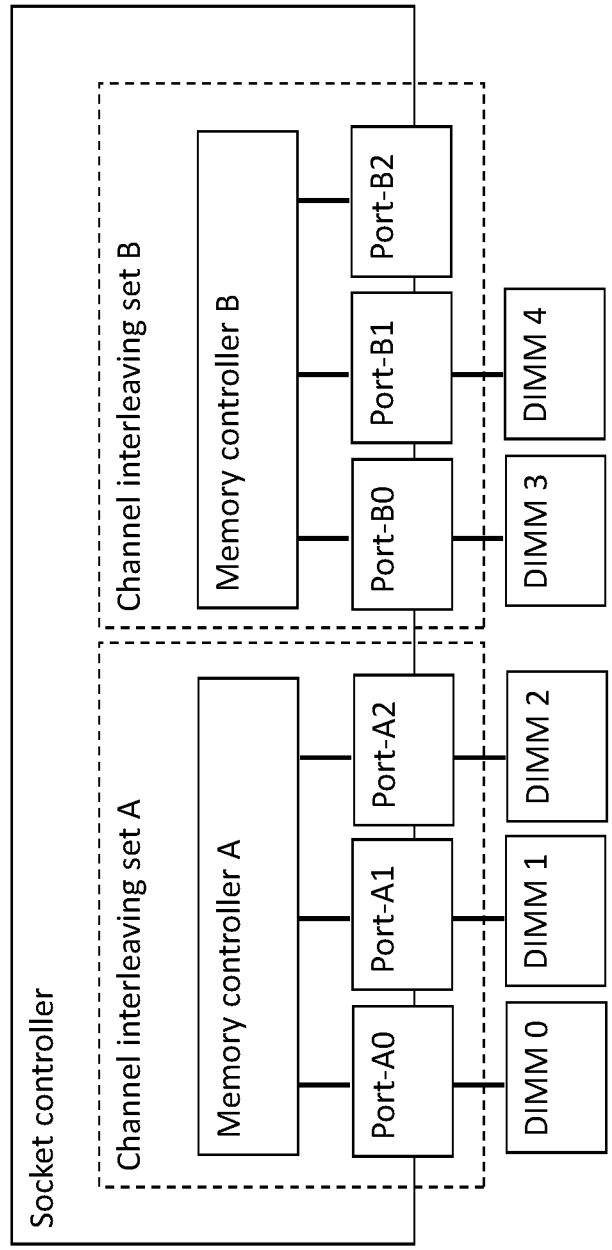
FIG. 1 is a block diagram, depicting an example for a common implementation of a memory interface load balancing system, as known to persons skilled in the art.

It will be appreciated that, for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention. Some features or elements described with respect to one embodiment may be combined with features or elements described with respect to other embodiments. For the sake of clarity, discussion of same or similar features or elements may not be repeated.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulates and/or transforms data represented as physical (e.g., electronic) quantities within the computer's registers and/or memories into other data similarly represented as physical quantities within the computer's registers and/or memories or other information non-transitory storage medium that may store instructions to perform operations and/or processes. Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. The term set when used herein may include one or more items. Unless explicitly stated, the method embodiments described herein are not constrained to a particular order or sequence. Additionally, some of the described method embodiments or elements thereof can occur or be performed simultaneously, at the same point in time, or concurrently.

Some embodiments of the present invention disclose a method and a system for efficiently accessing multiple memory interfaces and performing address interleaving for any interleaving rank at runtime, using dedicated hardware circuitry, hereby referred to as an interleaving circuit. The interleaving circuit may be configurable at runtime to support any value of interleaving rank and may implement non-exact division and modulo calculations and an anti-pattern hash function, as explained herein.

Reference is now made to FIG. 1, which is a block diagram, depicting an example for a common, commercially available implementation of a memory interface load balancing system.

As explained above, commercially available solutions may include receiving an initial physical address and applying an address interleaving algorithm on the received address, to produce a mapped physical address. Some state of the art processors may support interleaving ranks which are a power of 2 (e.g. 2, 4, 8, etc.) or equal to 3, or a combination thereof, but do not provide real interleaving for every possible value of the interleaving rank.

In the configuration depicted as an example in FIG. 1, a socket controller is configured to support access to a memory cluster including five connected memory devices (e.g., dual in-line memory modules (DIMMs)). Accordingly, the interleaving rank is also five. The socket controller may include one or more channel interleaving sets (e.g., interleaving set A and interleaving set B). Interleaving set A may support an interleaving rank of 3, and interleaving set B may support an interleaving rank which is a power of 2 (e.g., 2). The socket controller may divide the memory space according to the interleaving sets.

Assuming each memory device has a predefined size of 10 data units, region A may contain the lower 3/5 of the address space (e.g., addresses 0 thru 29), and region B may contain the upper 2/5 of the address space (e.g., addresses 30 thru 49). Sequential data stored within the memory cluster may be arranged as in the example depicted in Table 1:

TABLE 1

| Memory region A | | | Memory region B | |
|---|---|---|---|---|
| M0 | M1 | M2 | M3 | M4 |
| 0 | 1 | 2 | 30 | 31 |
| 3 | 4 | 5 | 32 | 33 |
| 6 | 7 | 8 | 34 | 35 |
| 9 | 10 | 11 | 36 | 37 |
| 12 | 13 | 14 | 38 | 39 |
| 15 | 16 | 17 | 40 | 41 |
| 18 | 19 | 20 | 42 | 43 |
| 21 | 22 | 23 | 44 | 45 |
| 24 | 25 | 26 | 46 | 47 |
| 27 | 28 | 29 | 48 | 49 |

A client computer that may require access to sequential data units 0 thru 9 would, therefore, need 4 memory read cycles, because the maximal throughput of stored data from memory region A is only 3/5 of the maximal throughput. A client computer that may require access to sequential data units 40 thru 49 would need 5 memory read cycles, because the maximal throughput of stored data from memory region B is only 2/5 of the maximal throughput.

In contrast, a system for providing real interleaving for every value of interleaving rank at run time may not divide the memory space, and may arrange the same data as depicted in Table 2:

TABLE 2

| M0 | M1 | M2 | M3 | M4 |
|---|---|---|---|---|
| 0 | 1 | 2 | 3 | 4 |
| 5 | 6 | 7 | 8 | 9 |
| 10 | 11 | 12 | 13 | 14 |
| 15 | 16 | 17 | 18 | 19 |
| ... | ... | ... | ... | ... |

In this example, a client computer that may require access to sequential data units 0 thru 9 would only need 2 memory read cycles, because the maximal throughput of stored data is achieved by interleaving of stored data among all 5 connected memory devices.

Figure 2:
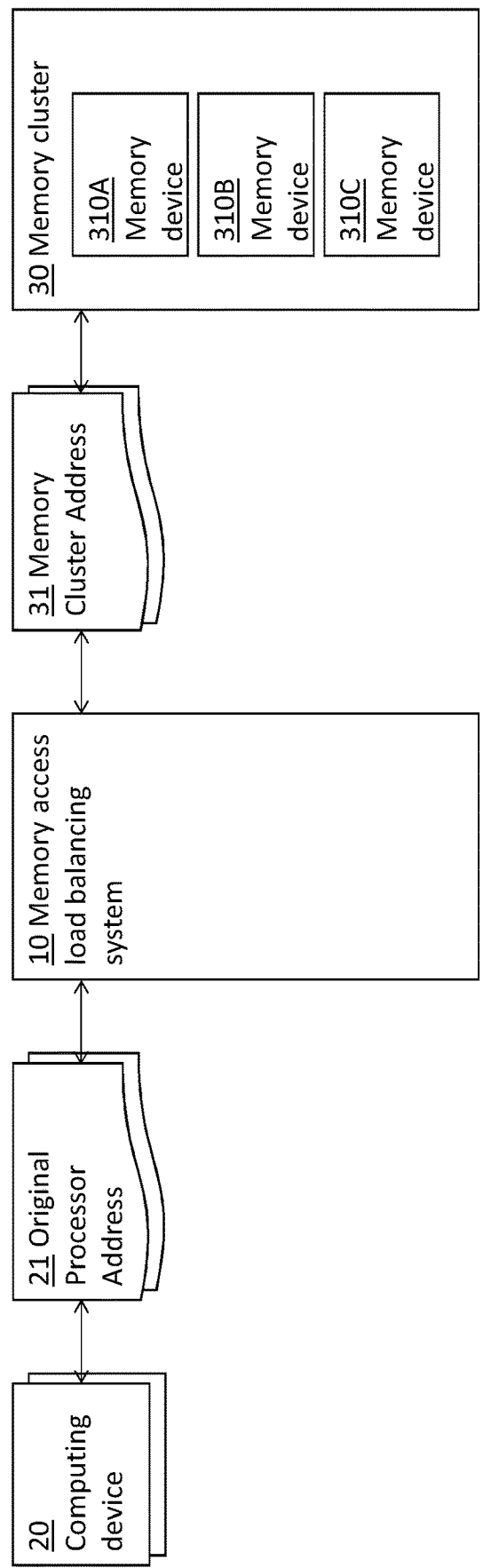
FIG. 2 is a schematic block diagram depicting a system 10 for load balancing of memory interface access, according to some embodiments.

Reference is now made to FIG. 2, which is a schematic block diagram depicting a system 10 for load balancing of memory interface access by a computing device, according to some embodiments.

Computing device 20 may require access (e.g., read access and write access) to one or more memory devices 310 (e.g., 310A, 310B and 310C) of memory cluster 30. For example, computing device 20 may be implemented as a central processing unit (CPU) in a computer, a Graphics Processing Unit (GPU) on a graphic accelerator board, and the like. Alternately, computing device 20 may be implemented as a network adapter, configured to receive memory access requests to memory devices 310 from one or more client computers, via a computer network.

Computing device 20 may emit a data access request, including a physical address 21 of a data object that may be stored on a memory device of memory cluster 30. The emitted physical address 21 is herein referred to as an Original Processor Address (OPA) 21.

According to some embodiments, computing device 20 may be connected to system 10 (e.g., by direct wired connection, via a common bus such as a Peripheral Component Interconnect Express (PCIE), via a computer network, and the like) to obtain access to at least one memory device of memory cluster 30.

Memory access load balancing system 10 (herein system 10) may convert OPA 21 to a memory cluster address (MCA) 31, to accommodate load balancing between an arbitrary number of different memory devices 310 of memory cluster 30, as explained herein.

Figure 3:
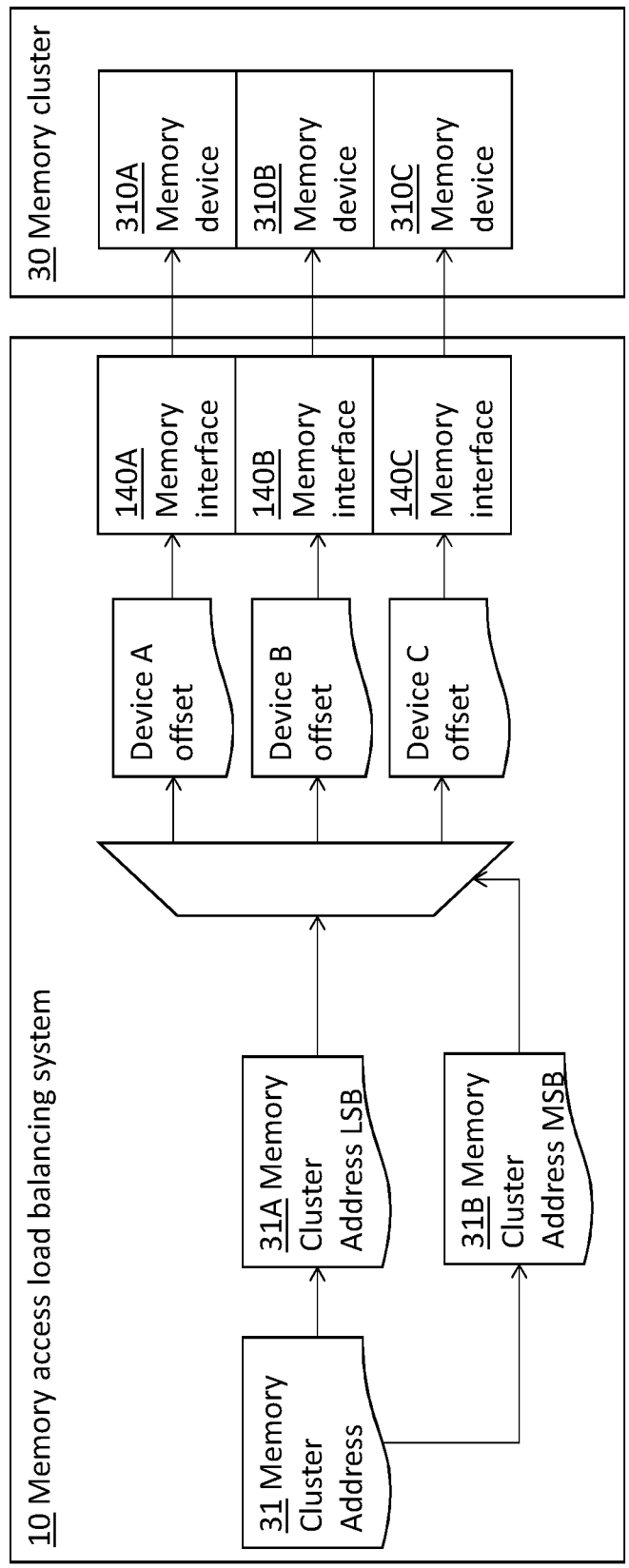
FIG. 3 is a schematic block diagram depicting a routing of an MCA address to specific memory device interfaces within a system for managing memory access load balancing, according to some embodiments.

Reference is now made to FIG. 3, which is a schematic block diagram depicting the routing of an MCA address to specific memory device interfaces within system 10, according to some embodiments of the invention. System 10 may include a plurality of memory interfaces 140, configured to enable connection of a memory device 310 thereto. For simplicity, each memory device 310 (e.g., 310A, 310B, 310C) depicted in FIG. 3 may have a single memory interface 140 (e.g., 140A, 140B, 140C). In alternative embodiments, at least one memory device may require a plurality of interfaces (e.g., DIMM device).

According to some embodiments, memory interfaces 140 are configured to access a common address space, manifested by memory cluster 30. Alternative embodiments may include one or more address spaces, manifested by a respective plurality of memory clusters 30. In such configurations, an additional arbitration component (not shown) may be required to select one memory cluster of the plurality of memory clusters.

As shown in FIG. 3, a memory cluster address 31 may be routed to a specific memory interface, and therefrom to a respective connected memory device according to one or more segments of memory cluster address 31. For example, an index or identity of a memory device may be selected according to a segment including the Most Significant Bits (MSBs) of memory cluster address 31, and a memory offset (e.g., address within a selected memory device, as an offset from its start address) may be selected according to a segment including the Least Significant Bits (LSBs) of memory cluster address 31.

Figure 4:
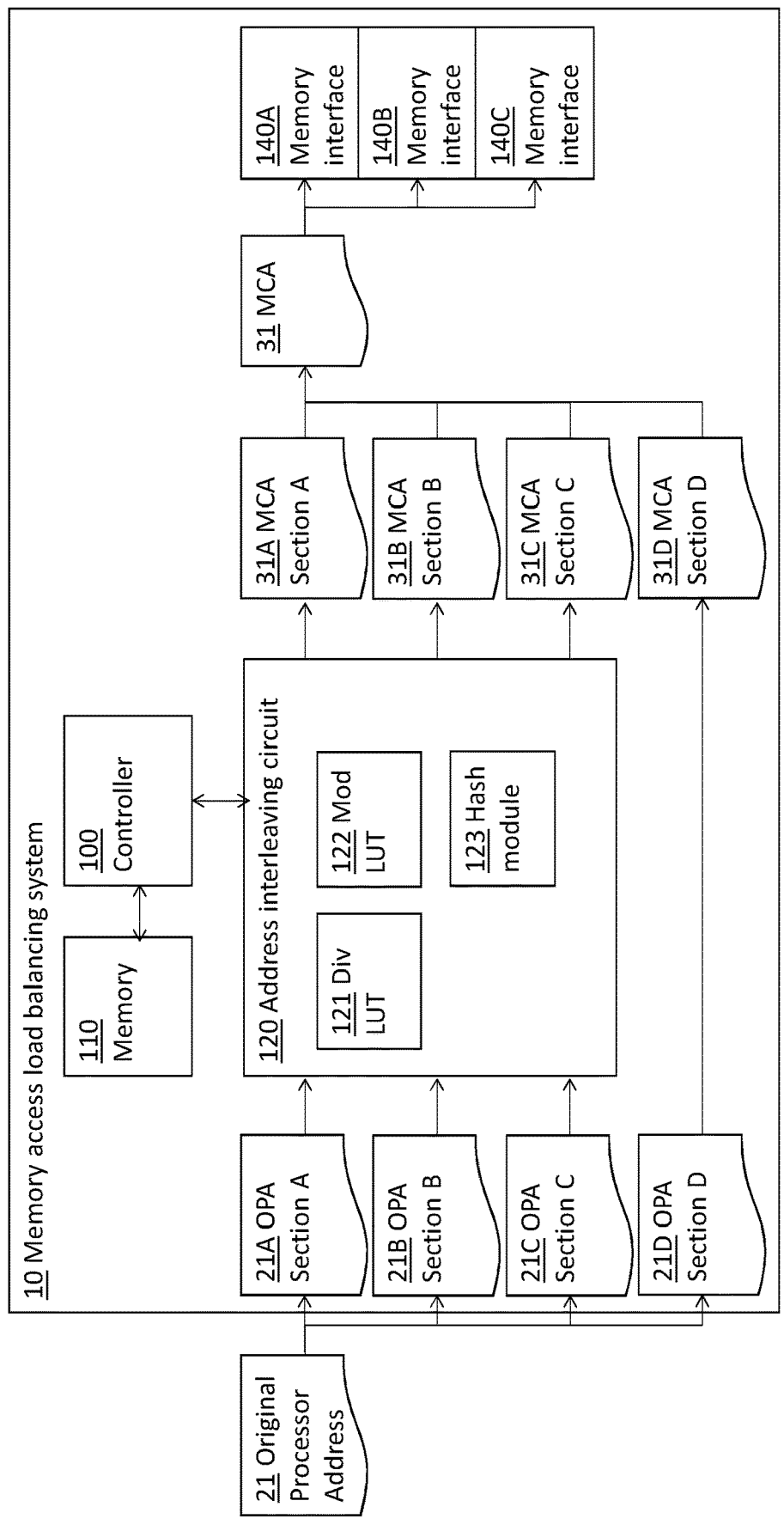
FIG. 4 is a block diagram depicting a memory access load balancing system according to some embodiments.

Reference is now made to FIG. 4, which is a block diagram depicting a memory access load balancing system according to some embodiments. System 10 may include a non-transitory memory device 110, wherein modules of instruction code are stored, and a controller 100 associated with the memory device, and configured to execute the modules of instruction code, whereupon execution of said modules of instruction code, controller 100 may be configured to perform at least one operation of memory access load balancing system 10, as explained herein.

According to some embodiments, an arbitrary integer number of memory devices 310 may be connected to the plurality of memory interfaces 140. This number of connected memory devices is hereby referred to as the "interleaving rank", as it corresponds with the number of devices for which address interleaving is required. According to some embodiments, the interleaving rank may be changed dynamically, for example by attaching or detaching a memory device (e.g., a DDR memory board) to a respective memory interface (e.g., a memory slot) in the computing device of system 10.

Controller 100 may be configured to determine the interleaving rank (e.g., by determining a number of occupied memory slots), which may be between 1 and the number of memory interfaces 140.

Controller 100 may receive at least one data object, corresponding to an OPA address 21 from the at least one computing device 20, and compute at least one interleaving function according to the interleaving rank.

The term interleaving function is used herein to refer to at least one mathematical function that may be performed by controller 100 on the OPA or on a section thereof, to obtain a mapped cluster address (MCA) address. For example, controller 100 may divide an OPA address to a plurality of sections, apply mathematical operations (e.g., division, multiplication, modulo, addition and subtraction) on a at least one section or a combination thereof, and concatenate a plurality of results of such mathematical operations to obtain an MCA 31, as explained herein.

MCA 31 may include a memory interface index, referring to an index of a memory device (e.g., element 310 of FIG. 2) and a memory interface offset, referring to an address offset from the start address of a memory device.

In some embodiments, controller 100 may perform the interleaving function as a software process. In alternate embodiments, controller 100 may configure at least one of element of address interleaving circuit 120 (e.g., content of division LUT 121, content of modulo LUT 122, and configuration of hash module 123), according to the interleaving rank, to map the OPA to an MCA according to the at least one interleaving function, so that the data object is equally interleaved among the connected devices.

Controller 100 may configure the at least one of element of address interleaving circuit 120 during runtime or as part as a boot sequence. For example, controller 100 may receive a hardware interrupt from a bus controller (e.g., a Peripheral Component Interconnect Express (PCIE) bus controller), relating to a change in the number of connected memory devices, and alternate at least one configuration of address interleaving circuit 120 accordingly.

System 10 may receive at least one original processor address (OPA) 21 from one or more computing devices (e.g., element 20 of FIG. 2).

System 10 may divide the OPA to a plurality (e.g., 4) of sections (e.g., OPA section A 21A, OPA section B 21B, OPA section C 21C, and OPA section D 21D), according to the OPA bit significance.

In some embodiments, system 10 may divide the OPA into three sections, in which:

OPA section A 21A may include the most significant bits (MSBs) of the OPA; OPA section B 21B may include the intermediate significant bits (ISBs); and OPA section C 21C may include the least significant bits (LSBs) of the OPA.

The different OPA sections may be used by address interleaving circuit 120, separately or in combination, to produce at least one MCA section (e.g., MCA section A 31A, MCA section B 31B, MCA section C 31C and MCA section D 31D), which may be combined to a memory cluster address (MCA) 31.

For example, system 10 may be configured to apply one or more interleaving functions to at least one of the OPA section A 21A, OPA section B 21B and OPA section C 21C, or a combination thereof and concatenating results of the one or more applied interleaving functions, to produce the MCA address, as explained herein.

In some embodiments, as shown in FIG. 4, system 10 may divide the OPA into four sections, in which:

OPA section A 21A may include the most significant bits (MSBs) of the OPA; OPA section B 21B may include the intermediate-high significant bits (IHSBs); OPA section C 21C may include the intermediate-low significant bits (ILSBs); and OPA section D 21D may include the least significant bits (LSBs) of the OPA, MCA section D 31D may include the LSBs of MCA address 31, and OPA section D 21D may derive MCA Section D 31D directly, bypassing address interleaving circuit 120.

In some embodiments, MCA Section A 31A may include the MSBs of MCA address 31, and may represent a selection of interface index, as explained in relation to FIG. 3.

Address interleaving circuit 120 may include at least one of a division lookup table (LUT) 121, a modulo LUT 122 and a hash module 123.

Figure 5:
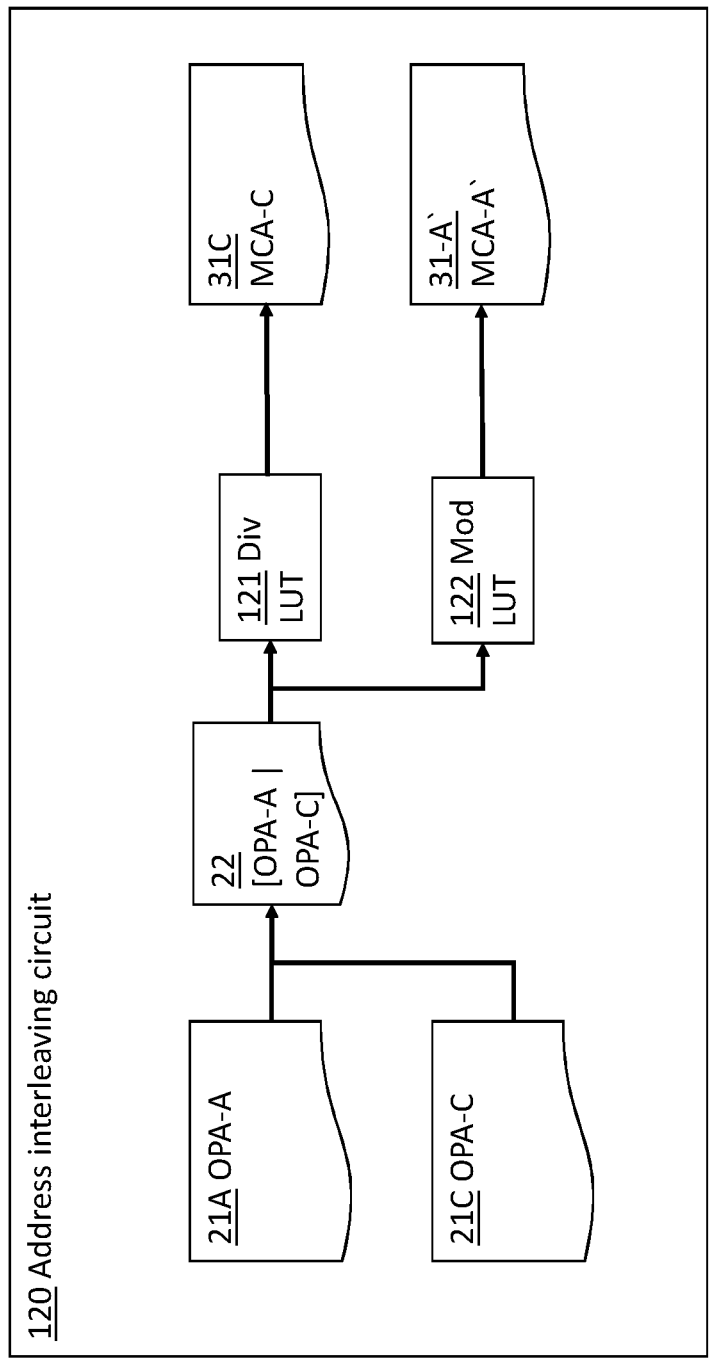
FIG. 5 is a block diagram depicting an implementation of at least one interleaving function by a system for managing memory access load balancing, according to some embodiments.

Reference is now made to FIG. 5, which is a block diagram depicting an implementation of at least one interleaving function by system 10, according to some embodiments.

System 10 may be configured to compute a first interleaving function by concatenating the bits of OPA section A 21A and OPA section C 21C and dividing the concatenation value by the interleaving rank. The result of the first interleaving function may be the value of a third section of the MCA address, MCA-C 31C.

In some embodiments, controller 100 may be configured to load (e.g., from memory module 110 of FIG. 4) a list of indexed, integer quotient values to a first lookup table (LUT), hereby referred to as a "Division LUT" 121. The integer quotient values may be selected according to the interleaving rank. For example, if the interleaving rank is 3, the first ten entries of the integer quotient values may be [0,0,0,1,1,1,2,2,2,3]. Controller 100 may introduce the concatenation value to the first LUT as an index and receive a quotient value from the division LUT 121, that is the result of an integer division of the concatenation value by the interleaving function. Pertaining to the same example, if the concatenation value is 5, division LUT 121 may return the value 1, corresponding to an integer division of 5 by 3.

System 10 may be configured to compute a second interleaving function by concatenating the bits of OPA section A 21A and OPA section C 21C and computing an integer modulo value that is the remainder of the division of the concatenation value by the interleaving rank. The result of the second interleaving function may be the value of a first section of the MCA address, MCA-A' (31-A').

In some embodiments, the modulo value may be computed according to division value discussed above, according to the following equation Eq. 1:

$$\text{Modulo-value}=\text{Concatenation-value}-(\text{Division-value}*\text{interleaving rank}) \qquad \text{Eq. 1}$$

Pertaining to the same example, the modulo value would be:

$$5-(1*3)=2.$$

In some embodiments, controller 100 may be configured to load (e.g., from memory module 110 of FIG. 4) a list of indexed, integer modulo values to a second LUT, hereby referred to as a "Modulo LUT" 122. The integer modulo values may be selected according to the interleaving rank. For example, if the interleaving rank is 3, the first ten entries of the integer quotient values may be [0,1,2,0,1,2,0,1,2,0]. Controller 100 may introduce the concatenation value to modulo LUT 122 as an index and receive a modulo value from LUT 122, that is the remainder of the division of the concatenation value by the interleaving function. Pertaining to the same example, if the concatenation value is 5, modulo LUT 122 may return the value 2, corresponding to an integer remainder of a division of 5 by 3.

Figure 6:
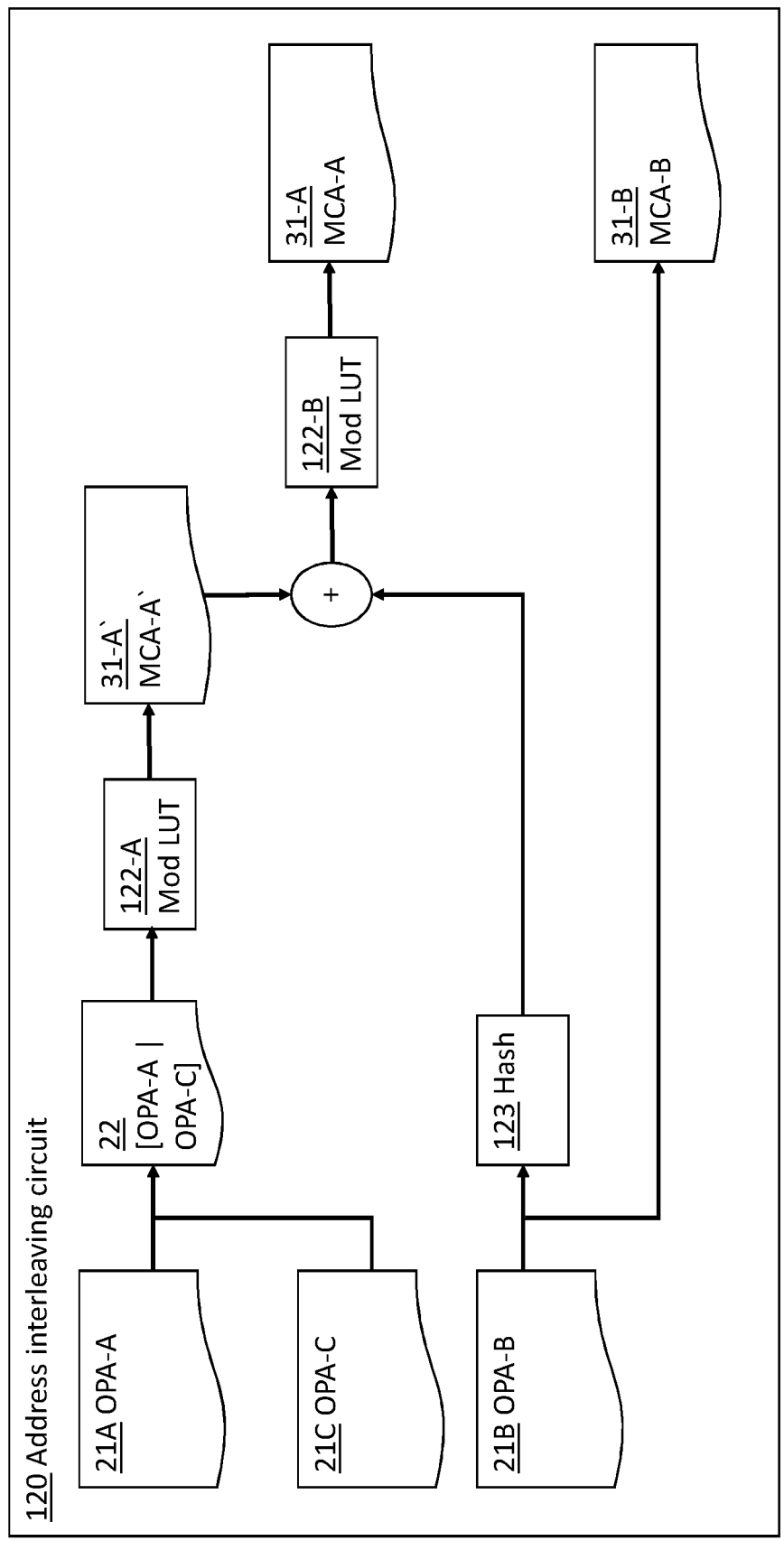
FIG. 6 is a block diagram depicting an implementation of at least one interleaving function by a system for managing memory access load balancing, according to some embodiments.

Reference is now made to FIG. 6, which is a block diagram depicting an implementation of at least one third interleaving function by system 10, according to some embodiments.

As explained above, when a memory cluster is accessed by a series of memory access operations with a pattern of a fixed address interval (e.g., a serial access to consecutive data objects of identical size), the computed memory index may remain the same, causing a memory access load balancing system to always map to the same memory-interface, thus not properly exploit multiplied memory bandwidth. For example, if the difference in address value between two consecutive memory accesses is an integer product of the interleaving rank (e.g., the number of memory interfaces), then the memory interface index may remain the same between the two consecutive memory access operations. A third interleaving function, as depicted in FIG. 6 may therefore be configured to prevent the effect of such a patterned memory access.

The production of MCA-A' by concatenation of sections OPA-A 21A and OPA-C 21C and computation of a modulo thereof according to the interleaving rank is the same as discussed above in relation to FIG. 5 and will not be repeated here.

Address interleaving circuit may include a hash module, configured to receive a section of OPA (e.g., OPA-B 21B) and apply a hashing function thereon. For example, the hashing function may be a cryptographic hashing function, including one of a checksum function, a cyclic redundancy check (CRC) function, and the like.

In some embodiments, controller 100 may configure at least one element of hash module 123 (e.g., determine a CRC seed), according to the interleaving rank. For example, hashing module may be configured to receive a set of predefined CRC seeds (e.g. in a look-up table), and select one seed according to the interleaving rank.

According to some embodiments, address interleaving circuit 120 may add the result of the hashing function (e.g., CRC) to MCA-A', and compute a second integer modulo value, that is the remainder of the division of the addition value by the interleaving rank.

According to some embodiments, address interleaving circuit 120 may compute the second integer modulo value by introducing the result of the addition to the modulo LUT 122 as an index and receiving the second integer modulo value from the LUT 122. In alternate embodiments, address interleaving circuit 120 may compute the second integer modulo value by subtracting the interleaving rank from the addition value.

As shown in FIG. 6, address interleaving circuit 120 may produce a second section of MCA (e.g., MCA-B) by directly copying second OPA-B.

Referring back to FIG. 4, system 10 may produce at least one MCA address by concatenating the results of the one or more applied interleaving functions. For example, system 10 may aggregate MCA address 31 by concatenating the second modulo value (e.g., element MCA-A 31A of FIG. 6), the second section (e.g., OPA-B 21B, which may be equal to MCA-B 31B of FIG. 6) and the quotient value (e.g., MCA-C 31C of FIG. 5) to produce an MCA address.

As explained above, according to some embodiments and as shown in FIG. 4, system 10 may split OPA to at least one of:

OPA-A including the MSBs of the OPA;
OPA-B including the intermediate-high significant bits (IHSBs);
OPA-C including the intermediate-low significant bits (ILSBs); and
OPA-D including the LSBs of the OPA.

In such embodiments, system 10 may produce at least one MCA address by concatenating the results of the one or more applied interleaving functions. For example, system 10 may aggregate MCA address 31 by concatenating the second modulo value (e.g., element MCA-A 31A of FIG. 6), the second section (e.g., OPA-B 21B, which may be equal to MCA-B 31B of FIG. 6), the quotient value (e.g., MCA-C 31C of FIG. 5), and the fourth section (e.g., OPA-D 21D, which may be equal to MCA-D 31D of FIG. 4) to produce an MCA address 31.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A method of balancing a load of access of at least one computing device to an arbitrary integer number of connected memory devices associated with a memory cluster address space, the method comprising:
    determining, by a controller, a number N corresponding to an arbitrary integer number of memory devices connected to a plurality of memory interfaces, wherein N is between 1 and the number of memory interfaces;
    receiving, by the controller, at least one data object, corresponding to an original processor address (OPA) from the at least one computing device;
    computing, by the controller, at least one interleaving function according to N; and
    mapping, by an interleaving circuit, the OPA to a memory cluster address (MCA), according to the at least one interleaving function, so that the data object is equally interleaved among the N connected devices, wherein mapping the OPA comprises:

splitting the OPA to at least one of: a first section, comprising the most significant bits (MSBs) of the OPA, a second section comprising intermediate significant bits (ISBs), and a third section comprising the least significant bits (LSBs) of the OPA;

applying one or more interleaving functions to at least one of the first section, second section and third section; and concatenating the results of the one or more applied interleaving functions, to produce the MCA address, and wherein computing a first interleaving function comprises concatenating the bits of the first section and the third section and dividing the concatenation value by N.

2. The method of claim 1, wherein division of the concatenation by N further comprises:

loading a list of indexed, integer quotient values according to N, to a first lookup table (LUT);

introducing the concatenation value to the first LUT as an index; and receiving a quotient value from the first LUT, that is the result of an integer division of the concatenation value by N.

3. The method of claim 2, wherein computing a second interleaving function comprises computing an integer modulo value, that is the remainder of the division of the concatenation value by N.

4. The method of claim 3, wherein computing a second interleaving function further comprises:

loading a list of indexed, integer modulo values according to N to a second LUT;

introducing the concatenation value to the second LUT as an index; and receiving a first integer modulo value from the second LUT, that is the remainder of the division of the concatenation value by N.

5. The method of claim 4, wherein computing a third interleaving function further comprises:

applying a hash function on the second section of the OPA;

adding the result of the hash function to the first integer modulo value;

computing a second integer modulo value, that is the remainder of the division of the addition value by N.

6. The method of claim 5, wherein computing a second integer modulo value comprises introducing the result of the addition to the second LUT as an index and receiving the second integer modulo value from the second LUT.

7. The method of claim 6, wherein concatenating the results of the one or more applied interleaving functions, comprises concatenating the second modulo value, the second section and the quotient value to produce an MCA address.

8. The method of claim 6 wherein:

the OPA is split to at least one of: a first section, comprising the MSBs of the OPA, a second section comprising intermediate-high significant bits (IHSBs), a third section comprising intermediate-low significant bits (ILSBs) and a fourth section comprising the LSBs of the OPA; and wherein concatenating the results of the one or more applied interleaving functions, comprises concatenating the second modulo value, the second section, the quotient value and the fourth section, to produce an MCA address.

9. The method of claim 5, wherein the hash function is one of a Cyclic Redundancy Check (CRC) function and a checksum function.

10. The method of claim 9, wherein a seed of the CRC function is selected according to N.

11. A system for balancing a load of access of at least one computing device to an arbitrary integer number of connected memory devices associated with a memory cluster address space, the system comprising:

a controller;

an interleaving circuit associated with the controller; and a plurality of memory interfaces, wherein the controller is configured to:

determine a number (N) corresponding to an arbitrary integer number of memory devices connected to a plurality of memory interfaces, wherein N is between 1 and the number of memory interfaces;

receive at least one data object, corresponding to an OPA from the at least one computing device; and compute at least one interleaving function according to N, wherein the interleaving circuit is configured to map the OPA to an MCA, according to the at least one interleaving function, so that the data object is equally interleaved among the N connected devices, wherein mapping the OPA comprises:

splitting the OPA to at least one of: a first section, comprising the MSBs of the OPA, a second section comprising the ISBs of the OPA, and a third section comprising the LSBs of the OPA;

applying one or more interleaving functions to at least one of the first section, second section and third section; and concatenating the results of the one or more applied interleaving functions, to produce the MCA address, and wherein computing a first interleaving function comprises concatenating the bits of the first section and the third section and dividing the concatenation value by N.

12. The system of claim 11, wherein the interleaving circuit comprises a first LUT, and wherein the controller is configured to: load a list of indexed, integer quotient values according to N, to the first LUT; introduce the concatenation value to the first LUT as an index; and receive, from the first LUT, a quotient value that is the result of the division of the concatenation value by N.

13. The system of claim 12, wherein the controller is further configured to compute a second interleaving function, that is a modulo function, equal to the remainder of the division of the concatenation value by N.

14. The system of claim 13, wherein the interleaving circuit comprises a second LUT, and wherein the controller is configured to compute the second interleaving function by:

loading a list of indexed, integer modulo values according to N to a second LUT;

introducing the concatenation value to the second LUT as an index; and receiving a first integer modulo value from the second LUT, that is the remainder of the division of the concatenation value by N.

15. The system of claim 14, wherein the interleaving circuit further comprises a hash module, configured to apply a hash function to an introduced input, and wherein the controller is further configured to:

introduce the second section of ISB bits to the hash module, to obtain a hash value;

add the hash value to the first modulo value;

introduce the result of the addition to the second LUT as an index; and receive a second modulo value from the second LUT, that is the remainder of the division of the addition value by N.

16. The system of claim 15, wherein the hash function is one of a Cyclic Redundancy Check (CRC) function and a checksum function.

17. The system of claim 16, wherein a seed of the CRC function is selected according to N.

18. The system of claim 15, wherein the results of the one or more applied interleaving functions are aggregated by concatenating the second modulo value, the second section and the quotient value to produce an MCA address.

19. The system of claim 15, wherein:
the OPA is split to at least one of: a first section, comprising the MSBs of the OPA, a second section comprising intermediate-high significant bits (IHSBs), a third section comprising intermediate-low significant bits (ILSBs) and a fourth section comprising the LSBs of the OPA; and wherein concatenating the results of the one or more applied interleaving functions, comprises concatenating the second modulo value, the second section, the quotient value and the fourth section, to produce an MCA address.

* * * * *